JOINING OF THERMALLY CONDUCTIVE CONTACT MEMBERS TO THERMOELECTRIC BODIES

Filed Aug. 31, 1962

United States Patent Office 3,330,029

Patented July 11, 1967

3,330,029

JOINING OF THERMALLY CONDUCTIVE CONTACT MEMBERS TO THERMOELECTRIC BODIES

Charles S. Duncan, Penn Hills Township, Allegheny County, Pa., and Geoffrey W. Wilson, Ponteland, England, assignors to Westinghouse Electric Corporation, East Pittsburgh, Pa., a corporation of Pennsylvania

Filed Aug. 31, 1962, Ser. No. 220,665

2 Claims. (Cl. 29—573)

The present invention relates to a thermoelectric device and a process for producing the same.

Heretofore in the production of thermoelectric devices, a body of thermoelectric material was joined to a metallic conductive member by a solder wherein the operation temperature of the device did not exceed the melting temperature of the solder. For example, a device produced by joining a thermoelectric body to a metallic conductive member with a soft solder would be capable of operating at a temperature of about 350° C. and lower since the maximum melting temperature of any soft solder is about 375° C.

The object of the present invention is to produce a thermoelectric device wherein a thermoelectric body is joined to a metallic conductive member with a soft solder whereby the device may be operated at temperatures up to the melting temperature of the thermoelectric material.

Another object of the invention is to provide a process for producing a thermoelectric device capable of operating at temperatures exceeding 375° C. by joining a thermoelectric body to a metallic thermally conductive contact member by ultrasonically prewetting the intended mating faces of the thermoelectric body and the contact member with a soft solder, compressing the intended mating faces together so as to squeeze out the excess solder at a temperature above the melting temperature of the soft solder and after cooling, reheating the assembly under compression to a temperature below the melting temperatuere of the thermoelectric material in an inert atmosphere.

Other objects of the invention will, in part, be obvious and will, in part, appear hereinafter.

In order to more fully understand the nature and objects of the invention, reference should be had to the following detailed description and drawings, in which.

In accordance with the present invention and in attainment of the foregoing objects there is provided a thermoelectric element suitable for use in a thermoelectric device comprising a thermoelectric body joined to one or more metallic, thermally conductive contact members. Examples of suitable thermoelectric bodies are one or more of the thermoelectric materials lead telluride, germanium bismuth telluride, germanium telluride and zinc antimonide. Generally, metallic sulfides, selenides, antimonides and tellurides may be employed in the process. The contact member comprises a relatively good electrically and thermally conductive metal, such as, iron, nickel, copper and stainless steel. The thermoelectric body and the contact member are joined with a low melting temperature soft solder (melting not above about 375° C.) such as lead or tin, or base alloys thereof by first ultrasonically prewetting the intended mating faces of the body and the member with the soft solder. Then, after the mating faces are disposed in proper relationship to each other, the assembly is compressed in a suitable jig at a temperature above the melting temperature of the soft solder so as to squeeze out all excess solder. After the assembly is cooled to room temperature, it is reheated under compression in an inert atmosphere to a temperature below the melting temperature of the thermoelectric material so that alloying takes place between the thermoelectric material and the residual thin layer of solder material, the thickness of the solder layer being of the order of 0.1 mil.

It should be appreciated that a complete thermoelectric device may be fabricated by this method. For instance, a body of a P-type thermoelectric material, such as, zinc antimonide and a body of N-type thermoelectric material, such as lead telluride may be disposed, at one end, on a nickel strap and joined thereto by the method hereinbefore described. Similarly, nickel contact caps may be disposed on and joined to the other ends of the thermoelectric bodies. Thereafter, electrical leads may be attached to the contact caps and the device may be utilized in some type of electrical circuit.

It should be further appreciated that a soft solder, that is, a solder having a melting point not exceeding 375° C., is being utilized to join thermoelectric bodies to metal contact members wherein the operating temperature of the complete device is not limited by the melting temperature of the soft solder material, but by the melting temperature of the thermoelectric material proper. This solder of lead and tin and base alloys thereof have been found to be the only soft solders that may be effectively employed herein.

The following examples are illustrative of the teachings of the invention.

*Example I*

Figure 1:
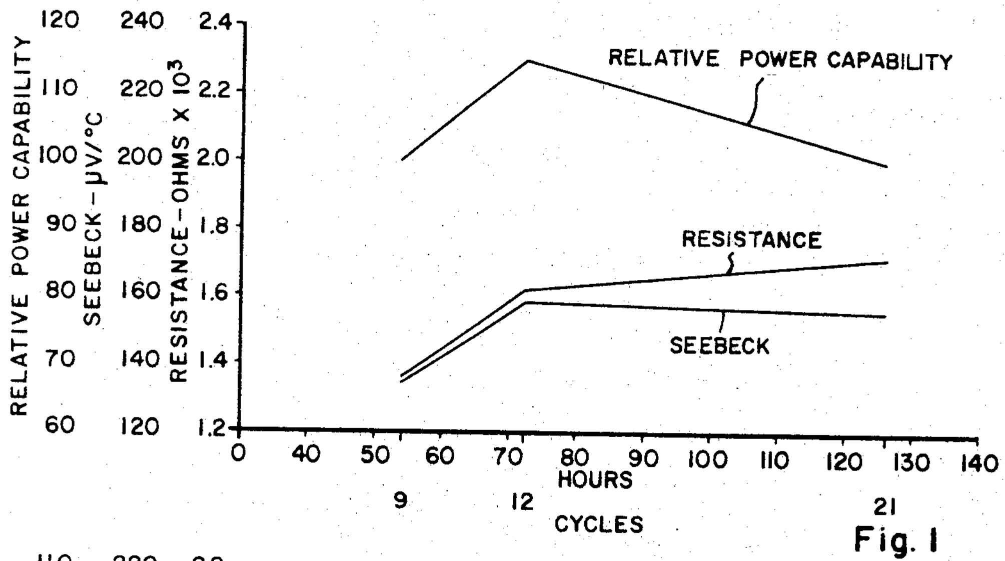
FIGURE 1 is a graph indicating the results of life tests on a lead telluride pellet joined to a stainless steel conductor with lead solder.

A lead telluride thermoelectric pellet (½" dia.) was joined to a stainless steel metallic contact with lead solder by the methods described hereinbefore. The contact was found to be satisfactory and the elements were life-tested for 140 hours in an atmosphere of argon. The results of these life-tests in terms of power capability, Seebeck value, and resistance are indicated in FIG. 1. Tests have shown that the bonded pellets will withstand 800° C. without coming apart.

*Example II*

Figure 2:
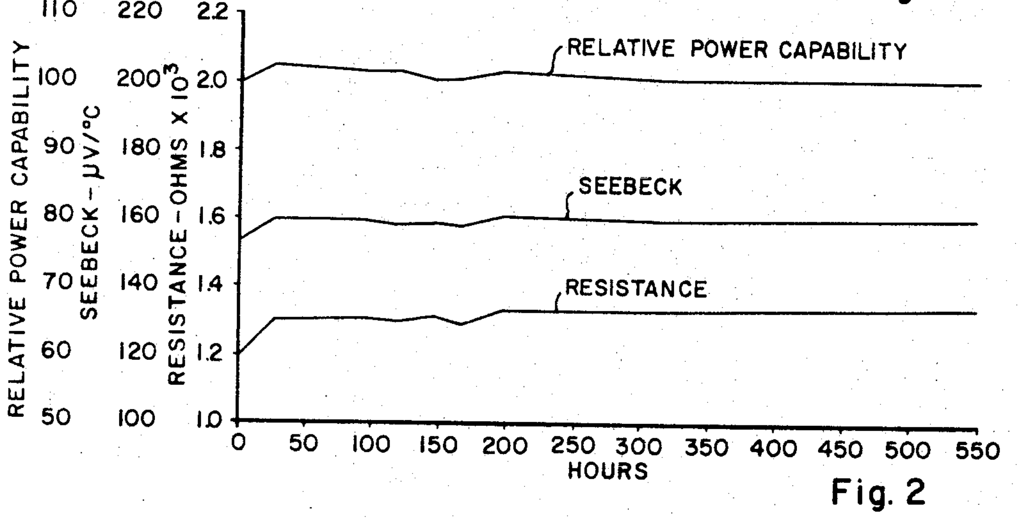
FIG. 2 is a graph indicating the results of life tests on a germanium bismuth telluride pellet joined to a stainless steel conductor with tin solder.

A germanium bismuth telluride pellet was joined to a stainless steel contact member with tin solder by the method hereinbefore described. The joint formed therebetween was satisfactory and the element was life-tested for 550 hours in an argon atmosphere. The results are indicated in FIG. 2.

*Example III*

Figure 3:
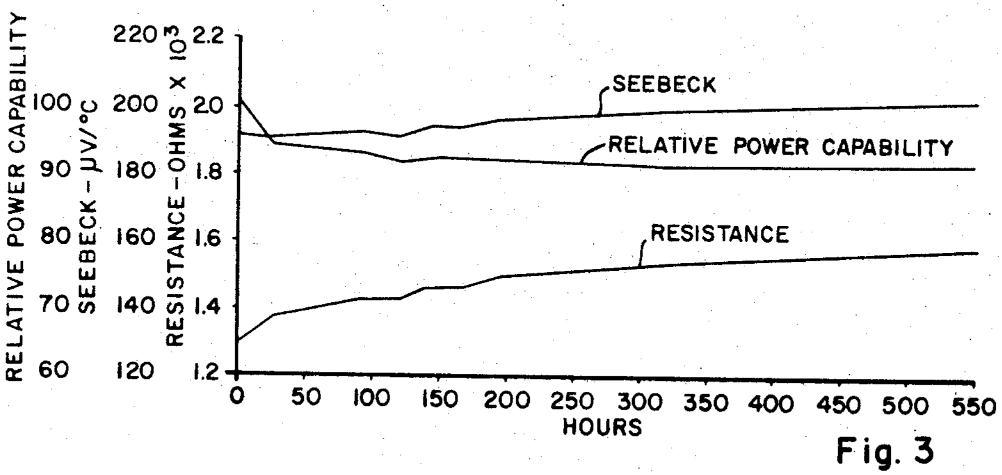
FIG. 3 is a graph indicating the results of life tests on a lead telluride pellet joined to a stainless steel conductor with tin solder.

A lead telluride thermoelectric pellet was joined to a stainless steel contact member with tin solder by the method described above. The joint formed therebetween was satisfactory and the element was life-tested in argon for 550 hours, the results of which are shown in FIG. 3.

*Example IV*

A zinc antimonide thermoelectric pellet was joined to a nickel contact member with tin solder. The resulting joint was relatively good. No life-tests were performed on this pellet.

All of the thermoelectric pellets tested were subjected to temperatures just below the melting temperature of the thermoelectric material with good results.

It is intended that the foregoing description and drawing be interpreted as illustrative and not in limitation of the invention.

We claim as our invention:

1. In the process for producing a thermoelectric device capable of operating at temperatures of up to the melting temperature of the thermoelectric material, the steps comprising (1) ultrasonically prewetting the intended mating faces of a thermoelectric body comprising a solid compound of at least one element selected from the group consisting of antimony, selenium and tellurium reacted with at least one other metallic element, and a thermally conductive contact member, the contact member comprising a metal selected from the group consisting of iron, nickel, and stainless steel with a soft solder selected from the group consisting of lead and tin and base alloys thereof, (2) disposing the mating faces in proper relationship to each other and compressing the assembly at a temperature above the melting temperature of the soft solder to squeeze out excess solder, and (3) cooling the assembly to room temperature before reheating the assembly under compression to a temperature below the melting temperature of the thermoelectric material in an inert atmosphere to effect alloying between the thermoelectric material and the residual thin layer of solder.

2. In the process for producing a thermoelectric device, the steps comprising (1) ultrasonically prewetting the intended mating faces of a thermoelectric body comprising a thermoelectric material selected from the group consisting of lead telluride, germanium telluride, germanium bismuth telluride and zinc antimonide, and a metallic, thermally conductive contact member with a soft solder, (2) disposing the mating faces in proper relationship to each other and compressing the assembly at a temperature above the melting temperature of the soft solder to squeeze out excess solder, and (3) cooling the assembly to room temperature before reheating the assembly under compression to a temperature below the melting temperature of the thermoelectric material in an inert atmosphere wherein a sound continuous joint is obtained by alloying between the thermoelectric material and the residual layer of solder, the device being capable of operating at temperatures exceeding the melting temperature of the soft solder.

References Cited

UNITED STATES PATENTS

| | | | |
|---|---|---|---|
| 2,877,283 | 3/1959 | Justi | 29—155.5 |
| 3,031,516 | 4/1962 | Pessel | 29—155.5 |
| 3,064,064 | 11/1962 | Jones | 136—4 |
| 3,082,508 | 3/1963 | Te Velde | 29—155.5 |
| 3,087,002 | 4/1963 | Henderson et al. | 136—4 |
| 3,126,616 | 3/1964 | Pietsch | 29—155.5 |
| 3,141,238 | 7/1964 | Harmon | 29—498 |
| 3,216,088 | 11/1965 | Fraser et al. | 29—155.5 |
| 3,238,614 | 3/1966 | Intrater | 29—155.5 |

JOHN F. CAMPBELL, *Primary Examiner.*

P. M. COHEN, *Assistant Examiner.*